United States Patent
Economikos et al.

[11] Patent Number: 6,057,216
[45] Date of Patent: May 2, 2000

[54] LOW TEMPERATURE DIFFUSION PROCESS FOR DOPANT CONCENTRATION ENHANCEMENT

[75] Inventors: Laertis Economikos, Wappingers Falls; Cheruvu S. Murthy, Hopewell Junction; Hua Shen, Beacon, all of N.Y.

[73] Assignee: International Business Machines Corporation, Armonk, N.Y.

[21] Appl. No.: 08/987,076

[22] Filed: Dec. 9, 1997

[51] Int. Cl.$^7$ .................................................. H01L 21/38
[52] U.S. Cl. ........................... 438/559; 438/249; 438/561; 438/563; 438/920
[58] Field of Search ..................................... 438/243, 246, 438/247, 249, 386, 389, 390, 392, 559, 560, 561, 563, 920

[56] References Cited

U.S. PATENT DOCUMENTS

| | | | |
|---|---|---|---|
| 3,607,468 | 10/1968 | Chang et al. | 438/566 |
| 3,718,502 | 2/1973 | Gibbons | 438/536 |
| 3,808,060 | 4/1974 | Hays et al. | 438/563 |
| 3,895,965 | 7/1975 | MacRae et al. | 438/506 |
| 4,049,478 | 9/1977 | Ghosh et al. | 438/566 |
| 4,274,892 | 6/1981 | Templin | 438/564 |
| 4,389,255 | 6/1983 | Chen et al. | 438/564 |
| 4,471,524 | 9/1984 | Kinsbron et al. | 438/303 |
| 4,472,212 | 9/1984 | Kinsbron | 438/564 |
| 4,544,418 | 10/1985 | Gibbons | 438/565 |
| 4,694,561 | 9/1987 | Lebowitz | 438/564 |
| 4,746,377 | 5/1988 | Kobayashi et al. | 438/770 |
| 4,794,434 | 12/1988 | Pelley, III | 257/301 |
| 4,833,094 | 5/1989 | Kenney | 438/249 |
| 5,173,440 | 12/1992 | Tsunashima et al. | 438/563 |
| 5,242,859 | 9/1993 | Degelormo et al. | 438/565 |
| 5,283,453 | 2/1994 | Rajeevakumar | 257/304 |
| 5,395,786 | 3/1995 | Hsu et al. | 438/248 |
| 5,434,109 | 7/1995 | Geissler et al. | 438/762 |
| 5,464,793 | 11/1995 | Roehl | 438/672 |
| 5,494,852 | 2/1996 | Gwin | 438/563 |
| 5,618,751 | 4/1997 | Golden et al. | 438/561 |
| 5,656,535 | 8/1997 | Ho et al. | 438/386 |
| 5,677,219 | 10/1997 | Mazure et al. | 438/243 |

OTHER PUBLICATIONS

Wolf, "Silicon Processing for the VLSI Era", vol. 1: Process Technology, pp. 182–187, 219–220, 262–266, 1986.

*Primary Examiner*—Chandra Chaudhari
*Attorney, Agent, or Firm*—Steven Capella

[57] ABSTRACT

Doped semiconductor with high dopant concentrations in small semiconductor regions without excess spreading of the doped region are formed by:

(a) applying a dopant-containing oxide glass layer on the semiconductor surface, (b) capping the dopant-containing oxide glass layer with a conformal silicon oxide layer, (c) heating the substrate from step (b) in a non-oxidizing atmosphere whereby at least a portion of the dopant in the glass diffuses into the substrate at the semiconductor surface, and (d) heating the glass-coated substrate from step (c) in an oxidizing atmosphere whereby at least a portion of the dopant in the glass near the semiconductor surface is forced into the substrate at the semiconductor surface by diffusion of oxygen through the glass.

The method is especially useful for making buried plates in semiconductor substrates which may be used in trench capacitor structures. The preferred semiconductor substrate material is monocrystalline silicon. The preferred dopant is arsenic.

17 Claims, 2 Drawing Sheets

LOW TEMPERATURE DIFFUSION PROCESS FOR DOPANT CONCENTRATION ENHANCEMENT

BACKGROUND OF THE INVENTION

The general manufacture of integrated circuit (IC) chips has been practiced for many years. The successful IC manufacture is often dependent on the ability to create regions of differing composition within the semiconductor wafer used as the substrate for the integrated circuit or within structures deposited on the wafer. The performance of these regions is often dependent on the degree of difference in composition. Thus, the function of a region may vary depending on its composition (e.g. concentration of dopant) and the composition of the regions surrounding it.

The continued demand for more compact and more detailed circuit designs in the integrated circuit industries often demands improved ability to create compositional differences having very tight tolerances (compositional and/ or dimensional). One design structure that has presented these demands is the so-called trench capacitor.

Trench capacitor structures usually comprise a trench in a semiconductor substrate (usually silicon). Immediately below the trench wall, the substrate is doped to increase its charge storage capacity to form one plate of the capacitor. Typically, the dopant (e.g. As) is put into place by diffusion or ion implantation. At the trench wall, a dielectric layer is formed to serve as the node dielectric of the capacitor. The trench is then filled with a conductive material (typically doped polycrystalline silicon) which becomes the second plate of the capacitor. The doped region below the node dielectric is often called the "buried plate" of the capacitor.

One advantage of the trench capacitor design is that it takes up less area relative to the principle plane of the substrate. Even with this inherent design advantage, there is a further demand to conserve space on the chip by placing the capacitors closer together. If the trench capacitors are placed too closely together, unwanted interactions may occur between the doped regions which form the buried plates of the adjacent capacitors. On the other hand, it is generally desired to have a high level of dopant in the buried plate so as to ensure good capacitor performance.

Conventional techniques have generally resulted in a trade-off. Where high doping was achieved, the size of the doped region increased such that close placement of the capacitors was impossible without unwanted interactions. Control of the size of the doped region has generally required the use of reduced dopant levels and worse performance. Thus, improved doping methods are needed for forming doped regions useful as buried plates in trench capacitors and other devices. Further, there is a need for trench capacitors having buried plates of high charge storage capacity and tight geometrical configuration. The need for high dopant levels in tight geometries may also be present in the fabrication of other integrated circuit components.

SUMMARY OF THE INVENTION

The invention provides processes which allow the achievement of high dopant concentrations in small semiconductor regions without excess spreading of the doped region.

In one aspect, the invention encompasses method of forming a doped semiconductor region in a semiconductor substrate having a semiconductor surface, the method comprising:

(a) applying a dopant-containing oxide glass layer on the semiconductor surface, (b) capping the dopant-containing oxide glass layer with a conformal silicon oxide layer, (c) heating the substrate from step (b) in a non-oxidizing atmosphere whereby at least a portion of the dopant in the glass diffuses into the substrate at the semiconductor surface, (d) heating the substrate from step (c) in an oxidizing atmosphere whereby at least a portion of the dopant in the glass near the semiconductor surface is forced into the substrate at the semiconductor surface by diffusion of oxygen from the oxidizing atmosphere through the glass.

Arsenic is a preferred dopant for use in the method of the invention.

In another aspect, the invention encompasses methods of making buried plates in semiconductor substrates using the above technique where the semiconductor surface is at least a portion of a trench formed in the substrate.

In another aspect, the invention encompasses semiconductor substrates having region of high dopant concentration in a buried plate configuration.

The invention is especially applicable for forming doped regions for use as buried plates in trench capacitor. The preferred semiconductor substrate material is silicon, especially monocrystalline silicon. These and other aspects of the invention are described in further detail below.

DETAILED DESCRIPTION OF THE DRAWINGS

The invention generally encompasses methods of forming doped regions in semiconductor surfaces. The need for this type of doping is most frequent in the instance of forming trench capacitors and other integrated circuit components.

Figure 1:
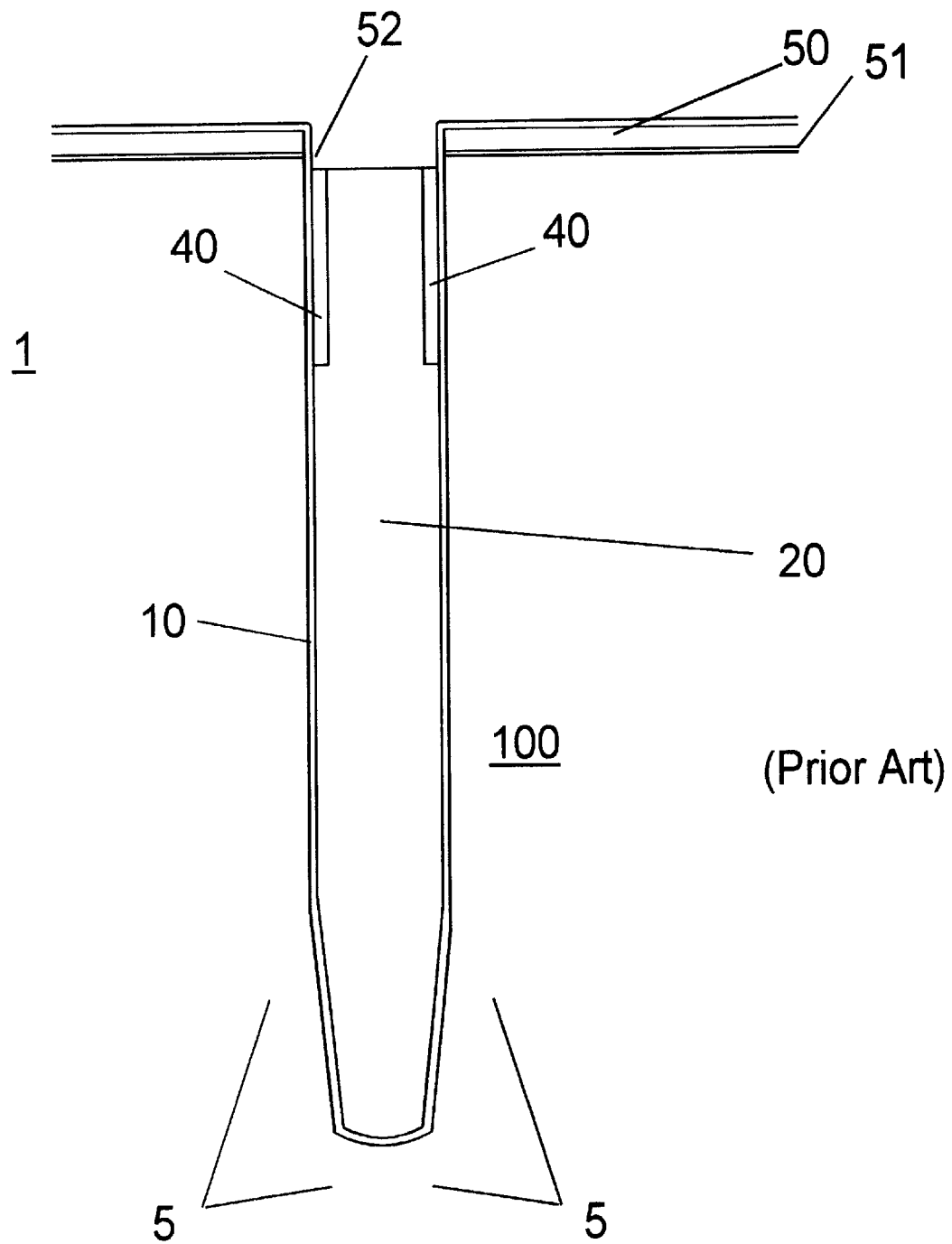
FIG. 1 is a schematic cross section of a typical trench capacitor with an oxide collar.

Referring to FIG. 1, typical fabrication of trench capacitors involves etching of an initial trench 100 into the substrate 1 (or wafer, usually a silicon wafer). Regions 5 in the substrate at the trench wall are typically doped to provide a region of increased charge storage capacity which will become one plate of the capacitor. A thin node dielectric layer 10 (usually a nitride) is formed as a conformal layer covering the trench surface. Usually prior to trench formation, one or more dielectric material pad layers 50 and 51 (usually nitride and oxide respectively) are deposited on the substrate. The trench 100 is then filled (filled and etched back) with a charge storage material 20 (typically a doped polysilicon) which serves as the other plate of the capacitor. In most trench capacitor designs, an oxide collar 40 is formed about the trench wall toward the entrance to the trench. This oxide protects against parasitic or leakage effects. The oxide collar may be formed before, after or between formation of the buried plate and node dielectric.

General techniques for forming trench capacitors having collar oxide features are known in the art. See for example the methods disclosed in U.S. Pat. Nos. 4,794,434; 5,283,453; 5,395,786; 5,434,109; 5,656,535; and 5,677,219, the disclosures of which are incorporated herein by reference.

The formation of the buried plate (or other highly doped regions of the semiconductor substrate) in accordance with the invention involves application of a dopant-containing oxide glass layer to the surface of the substrate where the doping is desired and capping the dopant-containing glass layer with a conformal oxide coating. After capping the dopant-containing glass layer, the substrate is subjected to a sequence of (1) heat treatment in a non-oxidizing atmosphere such that at least a portion of the dopant in the glass diffuses into the substrate and (2) heat treatment in an oxidizing atmosphere whereby at least a portion of the dopant in the glass near the semiconductor surface is forced into the substrate at the semiconductor surface by diffusion of oxygen from the oxidizing atmosphere through the glass.

Figure 2:
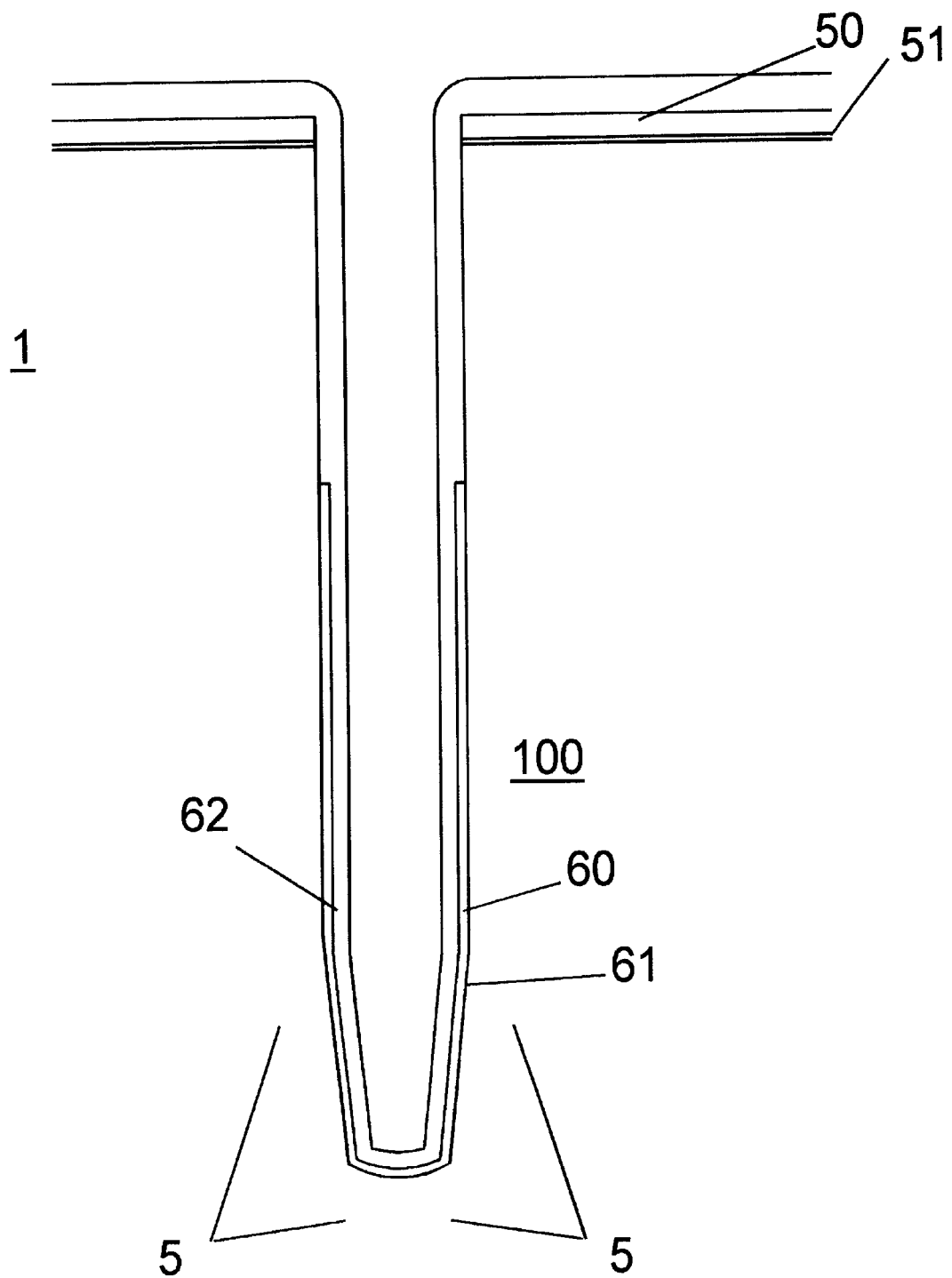
FIG. 2 is a schematic cross section of a trench with applied dopant-containing glass and conformal oxide layers according to a method of the invention.

Referring to FIG. 2, the dopant-containing glass layer 60 may be formed on the trench wall surface 61 of the substrate by any conventional method such as chemical vapor deposition (CVD), preferably LPCVD (low pressure). The dopant-containing glass layer is preferably applied as a conformal layer over the portion of the trench wall surface where the substrate doping is to take place. The dopant-containing glass is may contain a dopant such as boron, phosphorus, or arsenic as desired. The dopant-containing glass is preferably a silicate glass. For arsenic-containing glass (AsG), the glass is preferably deposited by LPCVD of a mixture of tetraethyl orthosilicate (TEOS) with an arsenic-containing organometallic compound such as TEOA (triethoxyarsine—$As(OC_2H_5)_3$) or TEAS (triethylarsenate—$OAs(OC_2H_5)_3$). Boron silicate glass and phosphorus silicate glass may be formed using similar CVD techniques with substitution of the appropriate boron or phosphorus constituent for the arsenic-containing organo-metallic compounds. The dopant-containing glass layer may also be formed by applying a doped spin-on-glass (SOG). Other techniques for forming doped glass layers may also be used. The concentration of dopant in the dopant-containing glass should be sufficient to create the desired dopant transfer to the semiconductor substrate under reasonable time and temperature conditions. Preferably, the dopant-containing glass has a dopant concentration of at least about $1 \times 10^{21}$ atoms/cm$^3$, more preferably at least about $2 \times 10^{21}$ atoms/cm$^3$, most preferably about $3 \times 10^{21}$–$6 \times 10^{21}$ atoms/cm$^3$. The thickness of the dopant-containing glass layer should be sufficient to provide the necessary amount of dopant to the substrate taking into account the dopant concentration in the dopant-containing glass and the desired dopant profile in the substrate. Preferably, the dopant-containing glass thickness is at least about 50 Å, more preferably at least about 100 Å, most preferably about 200–500 Å. It is generally preferred to use the minimum dopant-containing glass thickness necessary to reliably achieve the desired dopant concentration profile. In addition to cost considerations of using excess dopant-containing glass thickness, thickness above about 500 Å may present problems in terms of variation in dopant-containing glass thickness over the substrate surface. In general, the upper limit of combined thickness of the dopant-containing glass and its capping oxide is preferably dictated from the diameter of the deep trench. A uniform combined thickness is preferred in order to facilitate removal of the layers by etching after the buried plate is formed. A 500 Å dopant-containing glass layer with an 800 Å capping oxide layer is workable for 0.25 μm ground rule geometries.

Once the desired dopant-containing glass layer has been deposited. The dopant-containing glass layer is capped by depositing a conformal oxide layer 62 over the dopant-containing glass layer. The conformal oxide is preferably a silicon oxide formed by PECVD (plasma enhanced CVD) of $SiH_4$/$O_2$ at temperatures of less than 500° C. Alternatively, the conformal oxide may be formed by vapor deposition of tetraethyl orthosilicate (TEOS) with subsequent thermal treatment (preferably at temperatures below 800° C., more preferably less than 700° C.). The conformal oxide layer should be capable of transmitting oxygen to the dopant-containing glass layer, especially on exposure of the substrate to an oxidizing atmosphere. The primary function of the conformal oxide layer is to prevent excess evaporation/migration of dopant from the dopant-containing glass into the atmosphere surrounding the substrate while allowing the dopant-containing glass to be effectively be exposed to any oxidizing atmosphere used to treat the substrate. If used, the conformal oxide layer preferably has a thickness of about 1000 Å or less, more preferably about 400–800 Å.

The substrate with the applied dopant-containing glass layer is then subjected to the heat treatment of the invention which involves (1) heat treatment in a non-oxidizing atmosphere such that at least a portion of the dopant in the glass diffuses into the substrate and (2) heat treatment in an oxidizing atmosphere whereby at least a portion of the dopant in the glass near the semiconductor surface is forced into the substrate at the semiconductor surface by diffusion of oxygen from the oxidizing atmosphere through the glass.

The first heat treatment step is preferably conducted in a non-oxidizing atmosphere using a gas such as argon, helium or other noble gas or mixtures thereof. Other comparatively inert (and non-oxidizing) gases such as nitrogen may also be used alone or in combination with the noble gases. Argon is the most preferred gas for the non-oxidizing heat treatment. The non-oxidizing atmosphere may contain minor amounts of oxygen, however, the non-oxidizing atmosphere should have a lower effective oxygen partial pressure compared to the atmosphere used in the subsequent oxidizing treatment. Preferably, the non-oxidizing atmosphere is such that no significant diffusion (e.g., diffusion of oxygen to the dopant-containing glass/semiconductor interface to stop the diffusion of dopant from the dopant-containing glass to the semiconductor material). Preferably, the non-oxidizing atmosphere has an oxygen ($O_2$) partial pressure of about 0.1 atm or less, more preferably about 0.01 atm or less. The first heat treatment is preferably conducted at a temperature of at least about 1000° C., more preferably about 1000–1100° C., most preferably about 1025–1075° C. The first heat treatment step is preferably conducted for about 1–30 minutes, more preferably about 2–10 minutes. In general, longer times will result in greater penetration of the dopant into the substrate (i.e., greater junction depth).

After the first heat treatment, the substrate is then subjected to a further heat treatment in an oxidizing atmosphere. This second heat treatment is preferably conducted immediately after the first heat treatment (e.g. in the same furnace). The oxidizing atmosphere in the second heat treatment preferably contains $O_2$ gas in combination with a diluent gas. Alternatively, $H_2O$-containing atmospheres may be used where a more aggressive oxidizing environment is desired (e.g. to create shallow profiles of very high dopant concentration in the semiconductor material). $CO_2$ is preferably avoided since may leave undesired carbon deposits on the substrate or equipment. The oxidizing atmosphere preferably has an effective oxygen ($O_2$) partial pressure of at least about 0.2 atm, more preferably about 0.2–1 atm. Preferred diluent gases are $N_2$ or He, although other gases such as those used in the non-oxidizing treatment may be used as diluent gases. Where $H_2O$ is used as the oxidizing agent, the atmosphere is preferably about 1 atm steam. It is generally preferable to avoid atmospheres which are too oxidizing since such conditions may prematurely stop the migration of dopant from the dopant-containing glass to the semiconductor. The second heat treatment is preferably conducted at a temperature of less than about 1000° C., more preferably about 850–975° C., most preferably about 900–950° C. The second heat treatment is preferably conducted for about 30 minutes or less, more preferably for about 1–15 minutes, most preferably about 8–12 minutes. Preferably, the second heat treatment is conducted for a sufficient time for oxygen to diffuse through the dopant-containing glass layer toward the dopant-containing glass/substrate interface to force at least a partial displacement of dopant atoms from the dopant-containing glass into the substrate. Longer oxidation treatment times and more aggressive oxidation conditions tend to result in reduced junction depth in that a greater portion of the original semiconductor material at the glass/semiconductor interface is converted to oxide which is subsequently removed prior to formation of the node dielectric.

After the second heat treatment, the dopant-containing glass and any conformal oxide layer are preferably removed from the substrate by known techniques such as reactive ion etching or other selective etching technique. Any incidental substrate oxidation is also preferably removed at this time. Then, the substrate may be further processed to form the desired integrated circuit device in any desired manner.

The methods of the invention are not limited to any specific device geometry or design, however the invention is especially useful in the formation of trench capacitors and other trench-based components useful in integrated circuit designs. Preferably, the methods of the invention are used to form trench capacitors having aspect ratios (maximum trench depth measured from the top of the semiconductor material at the trench mouth 52 (FIG. 1)/maximum trench width) of at least about 5, more preferably at least about 20. Some circuit designs may require aspect ratios on the order of 30–50 or more. The invention encompasses resulting structures having unique dopant concentration configurations characterized by the combination of penetration (junction) depth and dopant concentration. The methods of the invention are capable of producing dopant concentrations in the substrate of at least about $3 \times 10^{19}$ atoms/cm$^3$, more preferably at least about $5 \times 10^{19}$ atoms/cm$^3$. In some instances, concentrations in excess of $10^{20}$ atoms/cm$^3$ may be achieved. In combination with these concentrations, the penetration depth is preferably between about 100–300 nm, more preferably about 140–200 nm. The concentration and penetration depth were measured using secondary ion mass spectroscopy (SIMS). On further processing of the substrate in the course of forming the integrated circuit, some diffusion of the dopant may occur such that the peak concentration is somewhat diminished in the final product. The final products using the method of the invention preferably retain a peak dopant concentration of at least about $1 \times 10^{19}$ atoms/cm$^3$, more preferably at least about $2 \times 10^{19}$ atoms/cm$^3$ after formation of the node dielectric and filling of the trench with the conductive material which forms the second plate of the capacitor.

The invention is especially useful where the substrate material is monocrystalline silicon, however, the invention may be practiced with other semiconductor substrate materials.

The invention is further illustrated by the following examples. The invention is not limited to the specific parameter values of the examples.

EXAMPLES

A starting monocrystalline silicon substrates having pad oxide and pad nitride surface layers and high aspect ratio trenches were provided using techniques generally known in the art. A layer of AsG was formed on portions of the trench wall of the substrates. The characteristics of the AsG layer are described in Table 1 below. Over the AsG layer, a conformal oxide layer was formed by PECVD of $SiH_4/O_2$. The characteristics of the conformal oxide layer are described in Table 1.

For examples 1 and 2, the substrates were heat treated in argon gas at 1050° C. for 2 minutes followed by heat treatment in a dry $O_2$-containing atmosphere—6 slm (standard liters/minute) of $O_2$ with 1% HCl at 1 atm at 950° C. for about 10 minutes. The HCl acts as a metal getter. Its use is optional.

As a comparison, examples 3 and 4 were heat treated using the same steps as in examples 1 and 2, but in reverse order (i.e., oxidation followed by annealing).

The conformal oxide and AsG layers were then removed and the arsenic concentration at the trench wall surface and the arsenic penetration depth were measured using SIMS. The results are shown in Table 2 below. The results indicate that the use of the method of the invention results in increased arsenic concentration levels with a modest increase of the penetration depth. The method allows increase of the dopant concentration and at the same time control of the penetration depth.

TABLE 1

| Example | Initial As conc. (atoms/cm$^3$) in AsG | AsG thickness (Å) | TEOS thickness (nm) |
|---|---|---|---|
| 1 | $1.05 \times 10^{21}$ | 200 | 400 |
| 2 | $1.05 \times 10^{21}$ | 100 | 400 |
| comparison 3 | $1.05 \times 10^{21}$ | 200 | 400 |
| comparison 4 | $1.05 \times 10^{21}$ | 100 | 400 |

TABLE 2

| Example | As substrate concentration (atoms/cm$^3$) | As penetration depth (nm) |
|---|---|---|
| 1 | $4.5 \times 10^{19}$ | 150 |
| 2 | $3.3 \times 10^{19}$ | 140 |
| comparison 3 | $3.1 \times 10^{19}$ | 127 |
| comparison 4 | $2.0 \times 10^{19}$ | 120 |

What is claimed is:

1. A method of forming a doped semiconductor region in a semiconductor substrate having a semiconductor surface in a trench in said substrate, said method comprising:

(a) applying a dopant-containing glass layer on said semiconductor surface in said trench, said glass having a dopant concentration of at least about $10^{21}$ atoms/cm$^3$, (b) capping said dopant-containing oxide glass layer with a conformal silicon oxide layer, (c) heating said substrate from step (b) at a temperature of about 1000° C. to 1100° C. for about 1–30 minutes in a non-oxidizing atmosphere whereby at least a portion of said dopant in said glass diffuses into said substrate at said semiconductor surface, (d) heat the substrate resulting from step (c) at about 850–975° C. for at least about 1 minute in an oxidizing atmosphere whereby at least a portion of the dopant in said glass near said semiconductor surface is forced into said substrate at said semiconductor surface by diffusion of oxygen through said glass.

2. The method of claim 1 wherein said semiconductor surface is a bottom wall of said trench.

3. The method of claim 1 wherein the glass applied in step (a) is a silicate glass.

4. The method of claim 3 wherein said glass is applied to said surface by vapor deposition.

5. The method of claim 2 wherein said trench has an aspect ratio of depth into said substrate to width of said trench of at least about 5:1.

6. The method of claim 1 wherein said non-oxidizing atmosphere contains at least one gas selected from the group consisting of nitrogen, argon and helium.

7. The method of claim 1 wherein said oxidizing atmosphere contains an oxygen component selected from the group consisting of $H_2O$, $O_2$ and mixtures thereof.

8. The method of claim 1 wherein said oxidizing atmosphere has an oxygen ($O_2$) partial pressure of at least about 0.2 atm.

9. The method of claim 8 wherein said oxidizing atmosphere has an oxygen ($O_2$) partial pressure of about 1 atm.

10. The method of claim 1 wherein said non-oxidizing atmosphere has an oxygen ($O_2$) partial pressure of less than about 0.1 atm.

11. The method of claim 1 wherein said glass layer and said conformal oxide layer are removed after step (d).

12. The method of claim 11 wherein said glass and conformal oxide layers are removed by reactive ion etching or by isotropic etching.

13. The method of claim 2 wherein said trench has a depth of at least about 5 $\mu$m.

14. The method of claim 1 wherein said semiconductor is silicon.

15. The method of claim 7 wherein said oxidizing atmosphere contains a diluent gas selected from the group consisting of nitrogen, argon, helium and mixtures thereof.

16. The method of claim 1 wherein said dopant is selected from the group consisting of boron, arsenic and phosphorus.

17. The method of claim 1 wherein said dopant is arsenic.

* * * * *